(12) United States Patent
Giebeler et al.

(10) Patent No.: US 8,648,303 B2
(45) Date of Patent: Feb. 11, 2014

(54) COMPACT INFRARED LIGHT DETECTOR AND METHOD FOR PRODUCING THE SAME, AND AN INFRARED LIGHT DETECTOR SYSTEM COMPRISING THE INFRARED LIGHT DETECTOR

(75) Inventors: Carsten Giebeler, Heemsteede (GB); Neil Conway, Dumfermline (GB); Timothy John Chamberlain, Edinburgh (GB)

(73) Assignee: Pyreos Ltd., Edinburgh (GB)

( * ) Notice: Subject to any disclaimer, the term of this patent is extended or adjusted under 35 U.S.C. 154(b) by 0 days.

(21) Appl. No.: 13/390,057

(22) PCT Filed: May 21, 2010

(86) PCT No.: PCT/EP2010/057050
§ 371 (c)(1), (2), (4) Date: Apr. 30, 2012

(87) PCT Pub. No.: WO2011/018253
PCT Pub. Date: Feb. 17, 2011

(65) Prior Publication Data
US 2012/0211658 A1    Aug. 23, 2012

(30) Foreign Application Priority Data
Aug. 11, 2009   (DE) .......................... 10 2009 037 111

(51) Int. Cl.
*G01J 5/00*    (2006.01)
(52) U.S. Cl.
USPC ...................................... 250/338.3
(58) Field of Classification Search
USPC .......................... 250/338.1–338.5
See application file for complete search history.

(56) References Cited

U.S. PATENT DOCUMENTS 4,425,502 A * 1/1984 Hall et al. ................. 250/338.3
4,516,027 A   5/1985 Schimmelpfennig et al.
(Continued)

FOREIGN PATENT DOCUMENTS

| CN | 1834599 A | 9/2006 |
|----|-----------|--------|
| DE | 19525071 A1 | 1/1997 |

(Continued)

OTHER PUBLICATIONS

Kazuhiko Hashimoto et al., Si monolithic microbolometers of ferroelectric BST thin film combined with readout FET for uncooled infrared image sensor, Sensors and Actuators A vol. 88 (2001) pp. 10-19.

(Continued)

*Primary Examiner* — Kiho Kim
(74) *Attorney, Agent, or Firm* — Sughrue Mion, PLLC

(57) ABSTRACT

An infrared light detector having a sensor chip (4), which includes a thin-film element (5) made from a pyroelectrically sensitive material, having an electrical insulator (27), at least one electronic component (17, 18) having a thin-film design, which forms part of a readout electronics unit, and a thin-film membrane (2), on which the sensor chip (4) and the electronic component (17, 18) are mounted side by side in an integrated manner such that the electronic component (17, 18) is electrically conductively coupled to the thin-film element (5). A signal amplifier (22), with which, in co-operation with the electronic component (17, 18), an electrical signal emitted from the sensor chip (4) can be amplified, can be connected to the electronic component (17, 18).

19 Claims, 1 Drawing Sheet

(56) References Cited

U.S. PATENT DOCUMENTS

Figure 1:
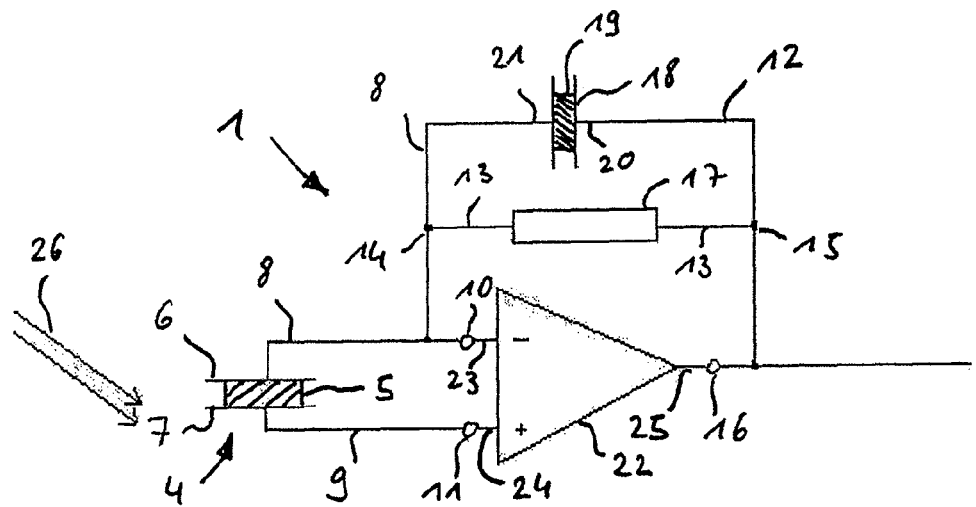

| | | | |
|---|---|---|---|
| 5,293,041 A * | 3/1994 | Kruse, Jr. | 250/338.3 |
| 6,049,080 A | 4/2000 | Ito | |
| 6,121,615 A | 9/2000 | Ito | |
| 6,329,655 B1 * | 12/2001 | Jack et al. | 250/338.1 |
| 7,405,403 B2 | 7/2008 | Vilain | |
| 2003/0066967 A1 * | 4/2003 | Hashimoto et al. | 250/338.2 |
| 2005/0006584 A1 * | 1/2005 | Kawakubo et al. | 250/338.2 |
| 2006/0180758 A1 * | 8/2006 | Troxell | 250/338.1 |
| 2008/0315100 A1 * | 12/2008 | Han et al. | 250/338.3 |

FOREIGN PATENT DOCUMENTS

| | | |
|---|---|---|
| DE | 197 39 477 B4 | 1/2005 |
| DE | 197 27 447 B4 | 6/2008 |
| EP | 0087514 A1 | 9/1983 |
| WO | 9309414 A1 | 5/1993 |

OTHER PUBLICATIONS

Chinese Search Report in Chinese Application No. 2010800428635.

* cited by examiner

COMPACT INFRARED LIGHT DETECTOR AND METHOD FOR PRODUCING THE SAME, AND AN INFRARED LIGHT DETECTOR SYSTEM COMPRISING THE INFRARED LIGHT DETECTOR

The invention relates to an infrared light detector with a compact design and an infrared light detector system with the infrared light detector. Furthermore, the invention relates to a method for producing the infrared light detector.

An infrared light detector for detecting thermal radiation has, for example, a pyroelectric sensor chip of thin-film construction with two electrode layers and a pyroelectric layer of pyroelectrically-sensitive substance arranged between the electrode layers. This substance is ferroelectric lead-zirconate-titanate (PZT). The electrode layers are made of platinum or a heat radiation absorbing chromium-nickel alloy. The layers are applied using a gas separator method. The sensor chip is mounted on a thin-film membrane which is prepared in a sandwich construction of silicon oxide and silicon nitride. Readout electronics are provided for reading out, amplifying, processing and/or forwarding an electrical signal generated due to the thermal radiation from the sensor chip.

The electrical signal is generated as a result of a charge shift from one electrode layer to the other electrode layer via the pyroelectric layer, so that a differential voltage and/or charges can be tapped at the electrode layers. The readout electronics, which have, for example, an electronic circuit with an operational amplifier or a junction field effect transistor, have a high electrical resistance, for example from 1 G$\Omega$ to 100 G$\Omega$, in order to generate a suitable processable signal from the electrical signal. Thus, the readout electronics generally have an electrical resistance and also a capacitor in combination with an operational amplifier, whereby the electrical resistance and possibly the capacitor are mounted together with the operational amplifier or the junction field effect transistor as discrete components separately from the infrared light detector, for example, on a printed circuit board. The readout electronics are electrically connected to the infrared light detector to enable interaction of the readout electronics with the infrared light detector.

Given that both the infrared light detector as well as the readout electronics consisting of the operational amplifier or the junction field effect transistor, the electrical resistance and the capacitor, are to be mounted as separate components, for example, on a circuit board, the space requirements for this known arrangement are high. The high space requirements are particularly disadvantageous if the components have to be accommodated in a housing in which there is only limited space. In addition, the infrared light detector and the readout electronics each have to be mounted in a separate process step. The infrared light detector and the readout electronics are connected together electrically via cable connections and soldering. Consequently, the assembly of the infrared light detector and the readout electronics is complicated and costly.

The object of the invention is to create an infrared light detector, a method for producing the infrared light detector and an infrared light detector system with the infrared light detector, whereby the infrared light detector system is space-saving and inexpensive to manufacture.

The infrared light detector according to the invention comprises a sensor chip having a thin-film element made from a pyroelectrically-sensitive substance with an electrical insulator, at least one electronic component of thin layer construction that forms a part of the readout electronics, and a thin-film membrane on which the sensor chip and the electronic component are so integrally-mounted side by side so that the electronic component is electrically conductively coupled to the thin-film element and a signal amplifier can be connected to the electronic component with which an electrical signal emitted from the sensor chip can be boosted by interaction with the electronic component. The infrared light detector system according to the invention comprises the infrared light detector and a junction field effect transistor and/or an operational amplifier for the signal amplifier, whereby the signal amplifier is connected to the infrared light detector.

Thus the electronic components are integrated directly onto the infrared detector in the present invention. This integration of the electronic components can be directly effected during manufacture of the infrared light detector, whereby no separate production of a separate readout electronics is needed. In this way, the production of the infrared light detector and the infrared light detector system is inexpensive. Furthermore, the design of the infrared light detector system saves space, since the electronic components are integrated on the infrared light detector. In addition, during the assembly process of the infrared light detector, the electronic components do not need to be provided as separate parts from the infrared light detector, which means that the handling of the infrared light detector is simple and cost-effective during assembly.

For example, if the infrared light detector according to the invention is provided for an infrared gas sensor, then it is known that a conventional T039 or a conventional T05 housing should be used to accommodate the infrared light detector. If the infrared gas sensor is used for multi-gas analysis, then the infrared gas sensor would have, for example, four sensor chips, each with associated readout electronics, whereby the infrared gas sensor has a complicated structure. Nevertheless, in the case of an infrared gas sensor configured according to this invention, the sensor chips with their associated electrical components can be effectively and compactly arranged within the housing of the infrared gas sensor.

Preferably, at least one electronic component is an electrical resistance and/or a capacitor with a dielectric thin-film element. The pyroelectric thin-film element and the dielectric thin-film element are preferably produced from the same substance of the same thickness. Alternatively, it is preferred that the dielectric thin-film element is produced from the same substance as the insulator i.e. a metal oxide, in particular alumina, whereby the insulator and the dielectric thin-film element are of the same thickness. The electrical resistance is preferably 100 M$\Omega$ to 500 G$\Omega$ and the capacitor is preferably from 0.1 pF to 100 pF.

The electrical resistance is preferably of thin-film construction, i.e. it is produced by depositing a thin titanium film, whereby the titanium is available in the manufacture of the pyroelectric thin-film element, since the PZT is deposited from three separate targets of lead, zirconium and titanium. The resistance is produced in an oxygen/argon environment, whereby the oxygen content lies preferably between 30% to 80% and the film thickness lies between 20 to 200 nm. The resistance value lies preferably between 0.1 G$\Omega$ and 100 G$\Omega$. The infrared light detector preferably has a base conduction path applied to the thin-film membrane, which contacts both the sensor chip as well as the electrical resistance and the capacitor as well as being connectable to the signal amplifier. Further preferably, the infrared light detector has a dielectric thin-film element that is applied on one side to one of the connecting surface sections of the base conduction path facing away from the thin-film membranes and contacting the latter, and a first intermediate conduction path, which is in contact with another side facing away from the one side, so that the capacitor is formed from the base conduction path, the dielectric thin-film element and the first intermediate conduction path in the thin-film construction.

The capacitance of the capacitor is defined as $C=\epsilon_o\epsilon_r A/d$, where C is the capacitance of the capacitor, A is the area of the overlap region of the base conduction path with the first intermediate conduction path viewed perpendicularly to the thin-film membrane, d is the thickness of the dielectric thin-film element, $\epsilon_r$ is the relative dielectric constant of the dielectric thin-film element and $\epsilon_o$ is the dielectric constant.

For example, if the dielectric thin-film element is produced from $Al_2O_3$ with an overlap area A of 300 μm² and a thickness d of 200 nm, we obtain a capacitance C for the capacitor of 0.25 pF.

The infrared light detector further comprises preferably a second intermediate conduction path via which the electrical resistance is connected in parallel to the capacitor by means of an electrically conductive connection with the base conduction path and the first intermediate conduction path. The electrical resistance may preferably be formed from a thin-film layer. Further, preferably, the infrared light detector has a base electrode, which is fixed to the thin-film membrane to receive the pyroelectric thin-film element and contacts with this as well as with the base conduction path so that the base electrode and the base conduction path extend over the surface of the thin-film membrane. In addition, preferably, the infrared light detector comprises a head conduction path and the sensor chip has a head electrode which is disposed on the side facing away from the base electrode of the pyroelectric thin-film element and contacts with the latter and the head conduction path. The head conduction path is led out via an insulator, which is made of an electrically insulating metal oxide layer, preferably an aluminum oxide layer, which is applied to the flank of the pyroelectric thin-film element. Preferably, the base electrodes, the base conduction path and the head electrode are made of platinum while the intermediate conduction paths are made of gold.

A base connection element is preferably connected to the base conduction path, an intermediate connection element is preferably connected to the intermediate connection element, and a head connection element is preferably connected to the head conduction path, so that a differential voltage and/or charge of the sensor chip can be tapped between the base connection element and the head connection element. The electrical resistance has a preferred rating of 100 MΩ to 500 GΩ while the capacitor has a preferred rating of 0.1 to 100 pF.

The method for producing the infrared light detector comprises the following steps: preparation of the thin-film membrane; deposition of pyroelectrically-sensitive substance on the thin-film membrane in order to form a thin film of the pyroelectrically-sensitive substance; removal of excess substance from the thin film, so that both the pyroelectric thin-film element together with the dielectric thin-film element are formed. Preferably, there are the further following steps: deposition of metal on the thin-film membrane to form a metal layer, whereby subsequently the deposition of the pyroelectrically-sensitive substance on the metal layer to form the thin film of the pyroelectrically-sensitive substance follows; removal of the excess substance from the metal layer and the thin film, so that both the pyroelectric thin-film element with its base electrode together with a base conduction path and the dielectric thin-film element are formed on the base conduction path. The pyroelectric thin-film element and the dielectric thin-film element are preferably of the same thickness.

Thus with the method according to the invention, simultaneously both the pyroelectric thin-film element as well as the dielectric thin-film element are formed and are arranged on the connection surface section of the base conduction path. In this way, the method according to the invention for manufacturing the infrared light detector according to the invention is efficient and cost-effective. Further, preferably, the method comprises the following step: deposition of a metal on the dielectric thin-film element to form a capacitor and on the thin-film membrane to form the second intermediate conduction path.

The other method for producing the infrared light detector comprises the following steps: preparation of the thin-film membrane; deposition of metal on the thin-film membrane to form a metal layer; deposition of a pyroelectrically-sensitive substance on the metal layer to form a thin film of the pyroelectrically-sensitive substance; removal of excess substance from the thin film and the metal layer, so that both the pyroelectric thin-film element with its base electrode can be formed together with a base conduction path, whereby the base electrode of the pyroelectric thin-film element has a lateral projection; deposition of a metal oxide layer to form an electrical insulator on the projection of the base electrode at the location where a head conduction path is provided, and to form the dielectric thin-film element on the base conduction path so that the dielectric thin-film element is formed together with the insulator. In this case, it is preferable that the insulator and the dielectric thin-film element are equally thick. As a further preferred step, the method comprises: deposition of a metal on the dielectric thin-film element to form a capacitor and on the thin-film membrane to form an intermediate conduction path. Further, preferably simultaneously, the metal is deposited in such a way that the head conduction path is produced.

Thus with the other method according to the invention, both the insulator and the dielectric thin-film element are formed simultaneously. In this way, the method according to the invention for manufacturing the infrared light detector according to the invention is efficient and cost-effective. Preferably, the pyroelectric thin-film element and the dielectric thin-film element used in the method according to the invention are of the same thickness. Preferably in the application of the other method according to the invention, the electrical insulator and the dielectric thin-film element are formed to have the same thickness.

Figure 2:
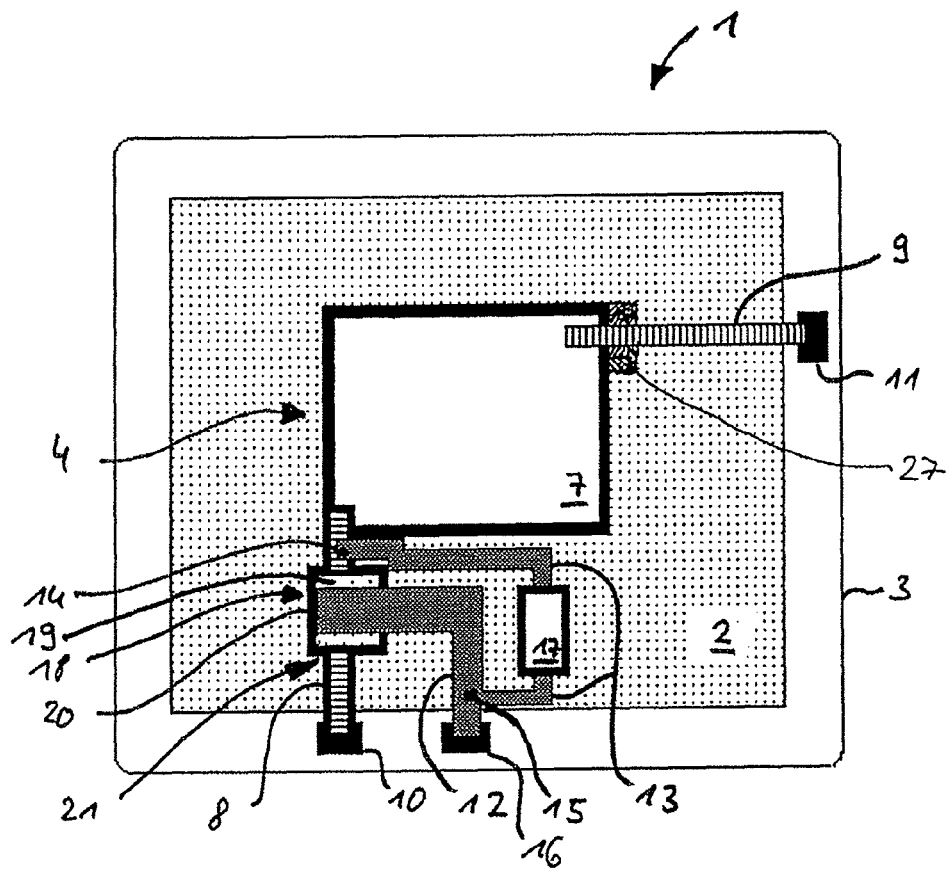

Hereinafter a preferred embodiment of an infrared light detector according to the invention and an infrared light detector system according to the invention are explained in the accompanying schematic drawings. In the drawings:

FIG. 1 shows a schematic circuit diagram of the embodiment of the inventive infrared light detector system, and FIG. 2 is a plan view of the embodiment of the infrared light detector according to the invention.

As is apparent from FIGS. 1 and 2, an infrared light detector 1 has a thin-film membrane 2, which is spanned by a support frame 3. A sensor chip 4 is mounted on the thin layer membrane 2, and is formed by a pyroelectric thin-film element 5, a base electrode 6 and a head electrode 7 whereby the pyroelectric thin-film element 5 is arranged as a layer structure between the base electrode 6 and the head electrode 7. The base electrode 6 is mounted on the thin-film membrane 2, so that the pyroelectric thin-film element 5 with the head electrode 7 is connected with the base electrode 6 on the thin-film membrane 2. The pyroelectric thin-film element 5 with its base electrode 6 and its head electrode 7 is approximately centrally arranged in the support frame 3 on the thin-film membrane 2.

In addition, a base conduction path 8 is mounted on the thin layer membrane 2, which is electrically conductively connected to the base electrode 6 and extends from the base electrode 6 in the direction of the support frame 3 on the thin-film membrane 2. In an analogous manner, a head conduction path 9 is provided on the sensor chip 4, which is electrically conductively connected to the head electrode 7 and likewise extends towards the support frame 3, whereby the head conduction path 9 is at right angles to the base conduction path 8. The base electrode 6 protrudes laterally from the pyroelectric thin-film element 5 in the form of a projection, whereby an aluminum oxide layer is deposited on the projection of the base electrode 6 to form an electrical insulator 27. The head conduction path 9 is led out via the insulator 27 which is applied to the flank of the pyroelectric thin-film element 5. Electrical insulation of the head conduction path 9 from the base electrode 6 is achieved with the help of the insulator 27, so that an electrical short circuit is prevented between the base electrode 6 and the head conduction path 9. A base connection element 10 is mounted on the support frame 3, to which the base conduction path 8 extends and which contacts the base conduction path 8. In addition, a head connection element 11 is mounted on the support frame 3, to which the head conduction path 9 extends and with which the head conduction path 9 contacts.

The base conduction path 8 has a connection surface section 21 which is arranged to face away from the thin-film membrane 2 and is centrally oriented with respect to the longitudinal direction of the base conduction path 8. A dielectric thin-film element 19 is deposited on the connection surface section 21 of the base conduction path 8, and contacts the connection surface section 21 with the base conduction path 8. A longitudinal end 20 of a first intermediate conduction path 12 is mounted on the dielectric thin-film element 19, i.e. on the side of the dielectric thin-film element 19 which faces away from the connection surface section 21 of the base conduction path 8, and contacts the dielectric thin-film element 19. The overlap surface that is between the longitudinal end 20 of the first intermediate conduction path 12 and the connection surface section 21 of the base conduction path 8 in the normal direction of the thin-film membrane 2 is 300 $\mu m^2$ in size. A capacitor 18 is formed with a capacity of 0.25 pF from the longitudinal end 22 of the first intermediate conduction path 12, the dielectric thin-film element 19 and the connection surface section 21 of the base conduction path 8.

The first intermediate conduction path 12 extends from its longitudinal end 20 towards the support frame 3 and an intermediate connection element 16 that is attached thereto and which is contacted by the first intermediate conduction path 12. A first conductor junction 15 is provided between the intermediate connection element 16 and the longitudinal end 20 of the first intermediate conduction path 12, and which contacts a second intermediate conduction path 13. The second intermediate conduction path 13 finally ends at a second conductor junction 14 that forms the second intermediate conduction path 13 with the base conduction path 8 between the connecting surface section 21 of the base conduction path 8 and the base electrode 6. An electrical resistor 17 is provided in the second intermediate conduction path 13 that is thus connected in parallel to the capacitor 18.

Incident thermal radiation 26 of the sensor chip 4 generates a charge displacement in the pyroelectric thin-film element 5, so that a differential voltage or charge is formed between the base electrode 6 and the head electrode 7. The strength of the differential voltage or the number of charges is a measure of the strength of the incident thermal radiation 26 so that the differential voltage can be used as a signal for an analysis. A desirable amplification of the signal strength is possible with an operational amplifier 22 that has an inverting input 23, a non-inverting input 24 and an output 25.

FIG. 1 shows a circuit diagram of an infrared light detector system with the infrared light detector 1 and the operational amplifier 22. The operational amplifier 22 is electrically conductively connected via its inverting input 23 to the base connection element 10, via its non-inverting input 24 to the head connection element 11 and via its output 25 to the intermediate connection element 16. Thus the differential voltage between the head electrode 7 and the base electrode 6 is applied between the inverting input 23 and the non-inverting input 24, whereby the capacitor 18 and the electrical resistance 17 are connected in parallel in feedback function between the inverting input 23 and the output 25.

The capacitor 18, formed from the connection surface section 21 of the base conduction path 8, the dielectric thin-film element 19 and the longitudinal end 20 of the first intermediate conduction path 11, the electrical resistance 17, which is arranged thin-film-wise on the thin-film membrane 2, and the intermediate conduction paths 12 and 13 are integrally mounted on the thin-film membrane 2 and are thus integral components of the infrared light detector 1. The connections 23 to 25 of the operational amplifier 22 are connected to the corresponding connection elements 10, 11 and 16 of the infrared light detector and thus form a separate component from the infrared light detector 1, whereby the infrared light detector 1 is likewise a separate component.

Thus the infrared light detector 1 is space-saving in its design and inexpensive to manufacture.

The following steps should be performed for the production of the infrared light detector 1: preparation of the thin-film membrane 2; deposition of a metal layer on the thin-film membrane 2; deposition of a pyroelectrically-sensitive substance on the metal layer; removal of excess substance from the pyroelectrically-sensitive substance and the metal layer, so that both the base electrode 6 together with the base conduction path 8 as well as the pyroelectric thin-film element 5 together with the dielectric thin-film element 19 are formed; deposition of a metal oxide layer to form an electrical insulator 27 on a projection of the base electrode 6 at the location where the head conduction path 9 is provided; deposition of a metal on the dielectric thin-film element 19 to form the first intermediate conduction path 12 and on the thin layer membrane 2 to form the second intermediate conduction path 13 and the head conduction path 9 which is mounted on the insulator 27. Finally, the head electrode 7 is produced by depositing metal on the dielectric thin-film element 5.

Alternatively the following steps can be performed to produce the infrared light detector 1: preparation of the thin-film membrane 2 with the base electrode 6, the base conduction path 8 and the pyroelectric thin-film element 5, whereby the base electrode 6 of the pyroelectric thin-film element 5 protrudes in the form of a projection; deposition of a metal oxide layer to form an electrical insulator 27 on the projection of the base electrode 6 at the location where the head conduction path 9 is provided, and to form a dielectric thin-film element 19 on the base conduction path 8 so that the dielectric thin-film element 19 is formed together with the insulator 27; deposition of a metal on the insulator 27 to form the head conduction path 9 as well as on the dielectric thin-film element 19 to form the first intermediate conduction path 12 and on the thin-film membrane 2 to form the second intermediate conduction path 13. Finally, the head electrode 7 is produced by deposition of a metal on the dielectric thin-film element 5.

LIST OF REFERENCE NUMERALS

1 Infrared light detector
2 Thin-film membrane

3 Support frame
4 Sensor chip
5 Pyroelectric thin-film element
6 Base electrode
7 Head electrode
8 Base conduction path
9 Head conduction path
10 Base connection element
11 Head connection element
12 First intermediate conduction path
13 Second intermediate conduction path
14 Second junction
15 First junction
16 Intermediate connection element
17 Electrical resistor
18 Capacitor
19 Dielectric thin-film element
20 Longitudinal end of the first intermediate conduction path
21 Connection surface section of the base conduction path
22 Operational amplifier
23 Inverting input
24 Non-inverting input
25 Output
26 Incident light
27 Insulator

The invention claimed is:

1. Infrared light detector comprising:
a sensor chip that has a thin-film element made from a pyroelectrically-sensitive substance with an electrical insulator, at least one electronic component of thin-film construction that forms part of readout electronics, and a thin-film membrane onto which the sensor chip and the electronic component are integrated such that the electronic component is electrically conductively coupled with the thin-film element, wherein the electronic component is configured to connect to a signal amplifier such that an electrical signal emitted from the sensor chip in cooperation with the electronic component is amplified,
wherein the at least one electronic component comprises a capacitor with a dielectric thin-film element, and
wherein the pyroelectric thin-film element and the dielectric thin-film element are of the same thickness and are made of the same substance.

2. Infrared light detector according to claim 1, wherein the at least one electronic component further comprises an electrical resistor.

3. Infrared light detector according to claim 2, wherein the electrical resistance is rated at 100 MΩ to 500 GΩ and the capacitor at 0.1 pF to 100 pF.

4. Infrared light detector according to claim 2, wherein the electrical resistor is of thin-film construction.

5. Infrared light detector system comprising an infrared light detector according to claim 1 and at least one of a junction field effect transistor and an operational amplifier for the signal amplifier, wherein the signal amplifier is connected to the infrared light detector.

6. Method for producing an infrared light detector according to claim 1, comprising the following steps:
preparing the thin-film membrane;
depositing a pyroelectrically-sensitive substance on the thin-film membrane to form a thin film of the pyroelectrically-sensitive substance; and
removing excess substance of the thin film, so that both the pyroelectric thin-film element as well as the dielectric thin-film element are formed together.

7. Method according to claim 6 further comprising the following steps:
depositing a metal on the thin-film membrane to form a metal layer;
removing the excess substance, so that both the pyroelectric thin-film element with its base electrode together with a base conduction path and the dielectric thin-film element are formed on the base conduction path.

8. Method according to claim 6, wherein the pyroelectric thin-film element and the dielectric thin-film element are produced from the same substance with the same thickness.

9. Method according to claim 6, further comprising the following step: depositing a metal on the dielectric thin-film element to form a capacitor and on the thin-film membrane to form an intermediate conduction path.

10. Infrared light detector, comprising:
a sensor chip that has a thin-film element made from a pyroelectrically sensitive substance with an electrical insulator, at least one electronic component of thin-film construction that forms part of readout electronics, and a thin-film membrane onto which the sensor chip and the electronic component are integrated such that the electronic component is electrically conductively coupled with the thin-film element and the electronic component is configured to connect to a signal amplifier such that an electrical signal emitted from the sensor chip in cooperation with the electronic component is amplified,
wherein the at least one electronic component comprises a dielectric thin-film element, and
wherein the insulator and the dielectric thin-film element are equally thick and are made of the same substance.

11. Method for producing an infrared light detector according to claim 10, comprising the following steps:
preparing the thin-film membrane;
depositing a metal on the thin-film membrane to form a metal layer;
depositing a pyroelectrically-sensitive substance on the metal layer to form a thin film of the pyroelectrically-sensitive substance;
removing excess substance from the thin film and the metal layer, to form a pyroelectric thin-film element, a base electrode for the pyroelectric thin-film element, and a base conduction path, wherein the base electrode of the pyroelectric thin-film element has a lateral projection; and
depositing a metal oxide layer to form an electrical insulator on the projection of the base electrode at the point where a head conduction path is provided, and to form the dielectric thin-film element on the base conduction path, so that the dielectric thin-film element is formed together with the insulator.

12. Method according to claim 11, wherein the dielectric thin-film element is produced from the substance of the insulator, and wherein the insulator and the dielectric thin-film element are of the same thickness.

13. Infrared light detector system comprising an infrared light detector according to claim 10 and at least one of a junction field effect transistor and an operational amplifier for the signal amplifier, wherein the signal amplifier is connected to the infrared light detector.

14. Infrared light detector according to claim 10, wherein the at least one electronic component further comprises an electrical resistor.

15. Infrared light detector according to claim 14, wherein the electrical resistor is of thin-film construction.

16. Infrared light detector according to claim 10, wherein the dielectric thin-film element forms part of a capacitor.

17. Infrared light detector, comprising:
a sensor chip that has a thin-film element made from a pyroelectrically sensitive substance with an electrical insulator, at least one electronic component of thin-film construction that forms part of readout electronics, and a thin-film membrane onto which the sensor chip and the electronic component are integrated such that the electronic component is electrically conductively coupled with the thin-film element and the electronic component is configured to connect to a signal amplifier such that an electrical signal emitted from the sensor chip in cooperation with the electronic component is amplified,
wherein the at least one electronic component comprises a dielectric thin-film element, and
wherein the dielectric thin-film element is produced from alumina.

18. Infrared light detector according to claim 17, wherein the substance of the insulator is a metal oxide.

19. Infrared light detector according to claim 17, wherein the dielectric thin-film element forms part of a capacitor.

* * * * *